United States Patent [19]
Cho et al.

[11] Patent Number: 6,093,642
[45] Date of Patent: Jul. 25, 2000

[54] TUNGSTEN-NITRIDE FOR CONTACT BARRIER APPLICATION

[75] Inventors: Chih-Chen Cho, Richardson, Tex.; Yoshimitsu Tamura, Ibaraki-ken, Japan; Jiong-Ping Lu, Dallas, Tex.

[73] Assignee: Texas Instruments Incorporated, Dallas, Tex.

[21] Appl. No.: 09/354,508

[22] Filed: Jul. 15, 1999

Related U.S. Application Data

[60] Provisional application No. 60/101,492, Sep. 23, 1998.
[51] Int. Cl.$^7$ .............................................. H01L 21/4763
[52] U.S. Cl. .................... 438/643; 438/648; 438/653; 438/664
[58] Field of Search ..................................... 438/627, 628, 438/629, 630, 643, 649, 653, 664

[56] References Cited

U.S. PATENT DOCUMENTS

| | | | |
|---|---|---|---|
| 4,884,123 | 11/1989 | Dixit et al. | 438/653 |
| 5,567,647 | 10/1996 | Takahashi | 438/653 |
| 5,591,671 | 1/1997 | Kim et al. | 438/643 |
| 5,633,200 | 5/1997 | Hu | 438/653 |
| 5,654,235 | 8/1997 | Matsumoto et al. | 438/643 |
| 5,723,362 | 3/1998 | Inoue et al. | 438/643 |

*Primary Examiner*—T. N. Quach
*Attorney, Agent, or Firm*—Jacqueline J. Garner; W. James Brady, III; Frederick J. Telecky, Jr.

[57] ABSTRACT

A contact and method of forming a contact. A layer of titanium (112) is deposited. Then, a RTP anneal is performed to react the titanium layer (112) with underlying silicon (112) to form a silicide layer (114). After the RTP anneal, a layer of tungsten-nitride (116) is deposited as a barrier layer. The metal interconnect layer (118) is then formed over the tungsten-nitride layer (116).

12 Claims, 2 Drawing Sheets

TUNGSTEN-NITRIDE FOR CONTACT BARRIER APPLICATION

CROSS-REFERENCE TO RELATED APPLICATIONS

This application claims priority under 35 USC §119(e)(1) of provisional application number 60/101,492 filed Sep. 23, 1998.

The following co-assigned pending application is related and hereby incorporated by reference:

| Ser. No. | Filing Date | Inventors |
|---|---|---|
| 60/067,608 | 12/5/97 | Rodder et al. |

FIELD OF THE INVENTION

The invention is generally related to the field of fabricating contacts in integrated circuits and more specifically to fabricating contacts with a tungsten-nitride contact barrier.

BACKGROUND OF THE INVENTION

As the density of integrated circuits, such as dynamic random access memory (DRAM) devices, has increased, the size of the contact hole for connecting to a metal layer has decreased while the aspect ratio of the contact hole has increased. As a result, the fabrication of contact structures for sub-micron complementary metal oxide semiconductor (CMOS) devices is difficult. Typically, a contact structure is formed after the formation of the capacitor elements. However, if the contact structure can be formed before the formation of the capacitor structure and withstand the high temperature steps required in the formation of the capacitor structure(s), the process flow can be simplified and a reduced aspect ratio for the contact hole(s) can be obtained.

A need has been felt for a technique for forming a contact with a diffusion barrier which is easy to fabricate, which results in low contact resistance, and which has sufficient thermal stability to withstand the process temperature required in the formation of capacitor elements.

SUMMARY OF THE INVENTION

A contact structure and method comprising a tungsten-nitride diffusion barrier is disclosed herein. Contact resistance is reduced by performing a rapid thermal process after refractory metal deposition to form silicide and then forming the tungsten-nitride diffusion barrier over the silicide.

An advantage of the invention is providing a contact having good thermal stability and low contact resistance.

This and other advantages will be apparent to those of ordinary skill in the art having reference to the specification in conjunction with the drawings.

DETAILED DESCRIPTION OF THE EMBODIMENTS

The invention will now be described in conjunction with a process for forming a contact between a metal interconnect layer and a source/drain region of a transistor. It will be apparent to those of ordinary skill in the art that the benefits of the invention may alternatively be applied to contacts to silicon material in general.

TiN has been the most widely used diffusion barrier material for contacts in integrated circuits. However, a very thick TiN layer is needed to prevent contact failure if the device has to endue a high temperature process after the contact is formed. As discussed in U.S. patent application Ser. No. 60/067,608 (TI-24164), filed Dec. 5, 1997, and assigned to Texas Instruments Incorporated, WN (tungsten-nitride) is a good diffusion barrier material that offers lower sheet resistance and better thermal stability than TiN barriers. However, in order to make a good contact, the diffusion barrier must not only prevent intermixing of the layers below (e.g., TiSi2) and above (e.g., W), but also provide low contact resistance. Unfortunately, contacts with WN diffusion barriers can have very high contact resistance. The embodiments of the invention described below provide a contact having WN diffusion barrier, better thermal stability than TiN, and low contact resistance.

Figure 1A:
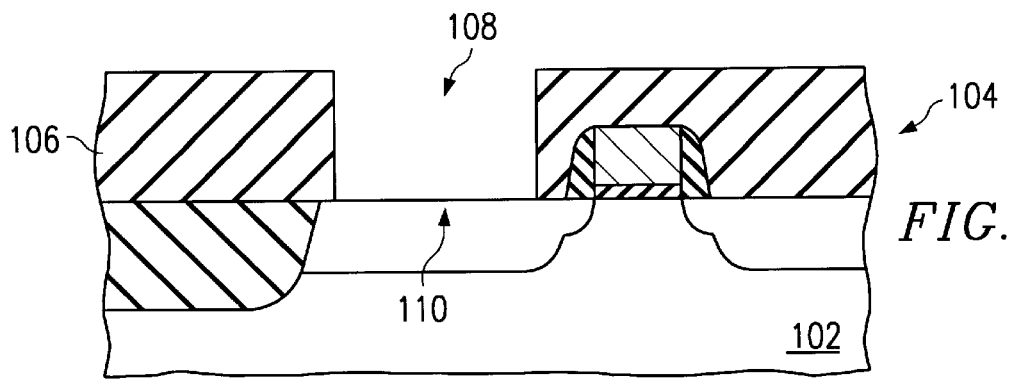
FIGS. 1A–1D are cross-sectional diagrams of a contact constructed according to a first embodiment of the invention at various stages of fabrication.

In a first embodiment of the invention, a semiconductor body 102 is processed through the formation of transistors, such as transistor 104 and other devices (not shown). Referring to FIG. 1A, semiconductor body 102 is further processed through the formation of a poly-metal dielectric (PMD) 106 that has been patterned and etched to form contact hole 108. Contact hole 108 exposes a portion of silicon 110 that may, for example, be a source/drain region of transistor 104.

Figure 1B:
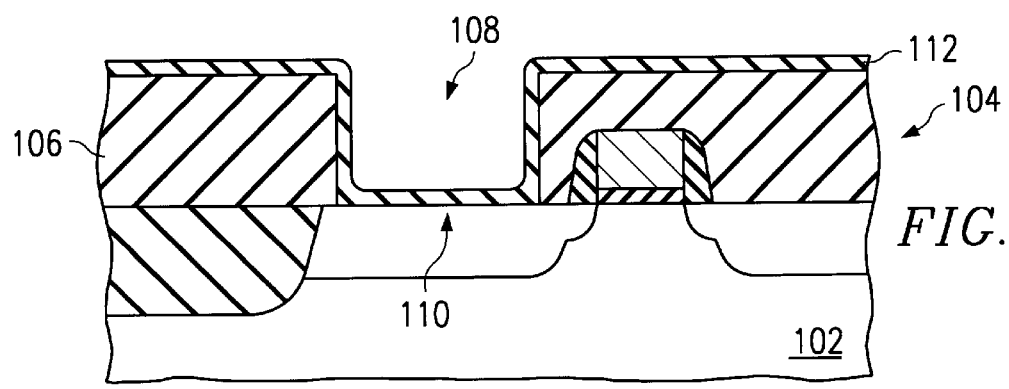

Referring to FIG. 1B, a layer of refractory metal (preferably titanium (Ti)) 112 is deposited over semiconductor body 102 including in contact hole 108 over silicon portion 110. Ti 112 may be deposited, for example, by collimated sputtering, ionized sputtering, or chemical vapor deposition as are known in the art. The thickness of Ti layer 112 is on the order of 200 Å. It will be apparent to those of ordinary skill in the art that other refractory metals, such as Co or Ni may alternatively be used for layer 112.

Figure 1C:
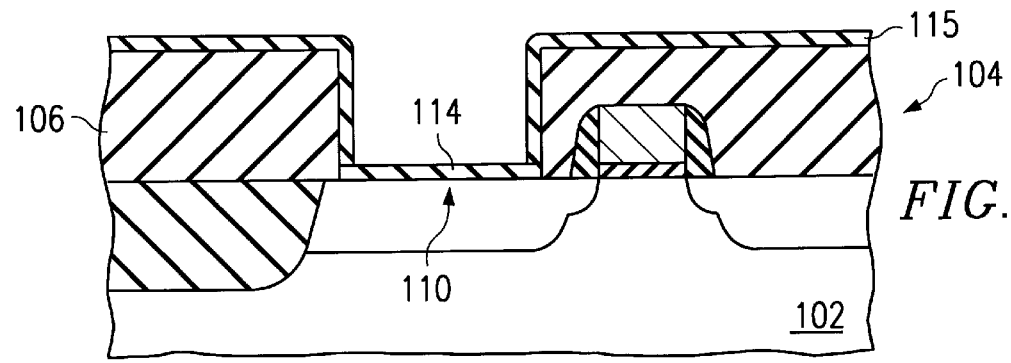

After deposition, the Ti layer 112 is subjected to a rapid thermal process (RTP) anneal using a nitrogen containing ambient. The RTP anneal is performed at a temperature on the order of 650° C. and preferably in the range of 650–700° C. The duration of the anneal is on the order of 30 sec. The purpose of the anneal is to react the Ti with silicon to form silicide 114 as shown in FIG. 1C. A thin layer of titanium-nitride (TiN) 115 is also formed.

It should be noted that $TiO_x$ could form on the surface of the Ti layer 112 if the react step cannot be performed in the same chamber as the titanium deposition. $TiO_x$ can increase the contact resistance of the final contact structure.

Figure 1D:
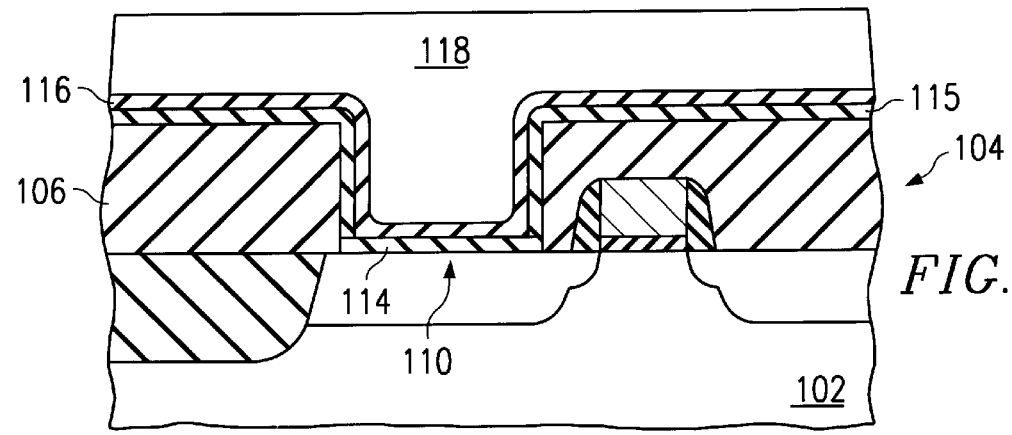

After the RTP anneal, a layer of tungsten-nitride (WN) 116 is formed over the structure including over silicide layer 114 as shown in FIG. 1D. WN layer 116 may be deposited by chemical-vapor-deposition (CVD) as is known in the art. The thickness of WN layer 116 is on the order of 300 Å, and preferably in the range of 50–500 Å.

Next, a metal interconnect layer 118 is deposited, patterned and etched. Preferably, metal interconnect layer 118 comprises W. This is followed by an anneal. The anneal occurs at a temperature on the order of 800° C. and has a duration on the order of 5 minutes.

In a second embodiment of the invention, a semiconductor body 202 is processed through the formation of transistors, such as transistor 204 and other devices (not shown). Semiconductor body 202 is further processed through the formation of a poly-metal dielectric (PMD) 206 that has been patterned and etched to form contact hole 208. Contact hole 208 exposes a portion of silicon 210 that may, for example, be a source/drain region of transistor 204.

Figure 2A:
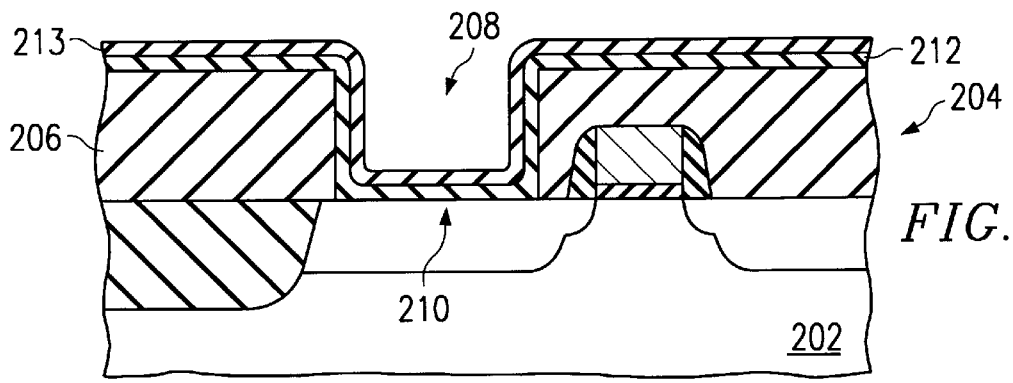
FIGS. 2A–2C are cross-sectional diagrams of a contact constructed according to a second embodiment of the invention at various stages of fabrication.

Referring to FIG. 2A, a layer of titanium (Ti) 212 is deposited over semiconductor body 202 including in contact hole 208 over silicon portion 210. Ti 212 maybe deposited, for example, by sputtering or CVD as is known in the art. The thickness of Ti layer 212 is on the order of 200 Å.

Next, a thin layer of TiN 213 is deposited over Ti layer 212. The thickness of TiN layer 213 is on the order of 100 Å. The purpose of TiN layer 213 is to prevent the formation of a TiO layer on the surface of Ti layer 212. Without TiN layer 213, TiO could form on Ti layer 212 when transferring the structure between process chambers (e.g., between deposition and silicide react chambers or between Ti deposition and WN deposition).

Figure 2B:
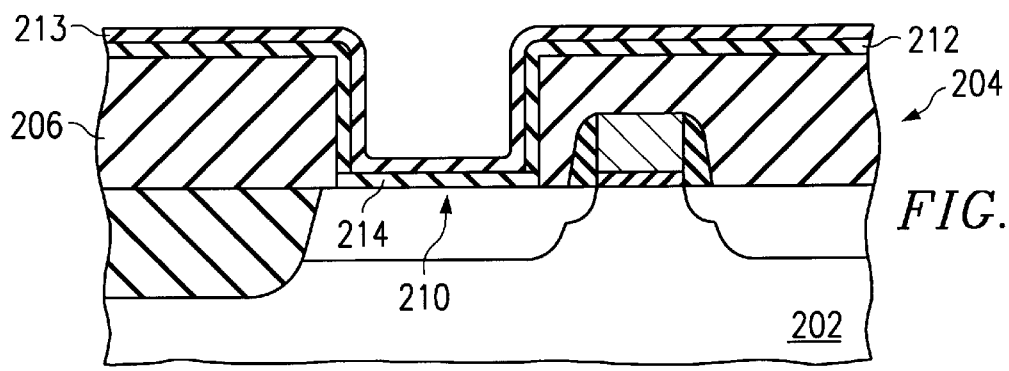

After deposition of TiN layer 213, the Ti layer 212 is subjected to a rapid thermal process (RTP) anneal. The RTP anneal is performed at a temperature on the order of 650° C. and preferably in the range of 650–700° C. The duration of the anneal is on the order of 30 sec. The purpose of the anneal is to react the Ti with silicon to form silicide 214 as shown in FIG. 2B, which decreases contact resistance.

Figure 2C:
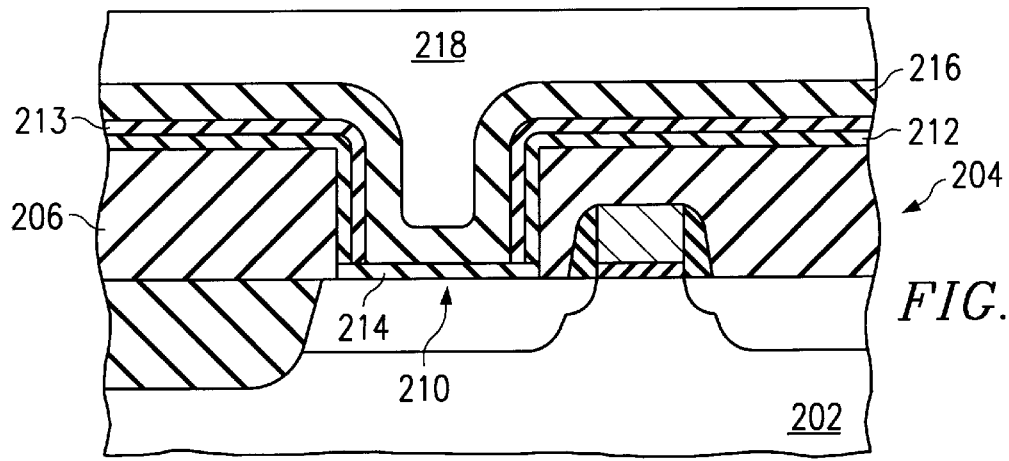

After the RTP anneal, a layer of tungsten-nitride (WN) 216 is formed over the structure including over silicide layer 214 and TiN layer 213 as shown in FIG. 2C. WN layer 216 may be deposited by chemical-vapor-deposition (CVD) as is known in the art. The thickness of WN layer 216 is on the order of 300 Å, and preferably in the range of 50–500 Å. The use of WN reduces the sheet resistance of the contact. As a result, a thinner metal layer for the interconnect can be used for the same total sheet resistance. This, in turn, results in reduced capacitance. This is especially useful for bitlines in DRAM memory chips.

Next, a metal interconnect layer 218 is deposited, patterned and etched. Preferably, metal interconnect layer 218 comprises W. This is followed by an anneal. The anneal occurs at a temperature on the order of 800° C. and has a duration on the order of 5 minutes.

was deposited by collimated sputtering. The thickness of the WN is 500 Å on the field areas. Each process was subsequently subjected to a 800° C. 5 min anneal after M1 deposition. Resistance values are shown both before and after the final anneal.

In Process 1, Ti is deposited on silicon and followed by tungsten-nitride deposition. The Ti thickness is 400 Å and the WN thickness is 500 Å. A 725° C., 30 sec. rapid thermal process for silicide formation follows deposition. The sheet resistance (M1 ohm/sq) is low. However, this process results in higher contact resistance, especially for the P-channel transistors. The n/a in Table 1 refers to a resistance that is so high that it is out of the measurement range. Even worse contact resistance is observed when the Ti thickness is reduced to 200 ÅA. Leakage current was also found to be high using this process.

Process 2 relates to the first embodiment of the invention in which 200 Å of Ti is deposited over silicon. The RTP anneal (for silicide formation) is then performed prior to the deposition of 500 Å of WN. The sheet resistance is increased from that of Process 1 but lower than that of Process 4. Contact resistance is significantly reduced for the P-channel transistors from Process 1. Contact resistance after the 5 min anneal is also reduced.

Process 3 relates to the second embodiment of the invention in which 200 Å of Ti is deposited followed by 100 Å of TiN. The RTP anneal (for silicide formation) is then performed followed by the deposition of 500 Å of WN. Sheet resistance is the lowest for the 4 processes. In addition, contact resistance is reduced from Process 1 for both P-channel and N-channel transistors. Thinner TiN results in lower stress compared to Process 4 and WN deposited after the RTP silicide react in anneal prevents punchthrough.

Process 4 is a prior art process in which 200 Å of Ti is deposited followed by ECVD of 500 Å of TiN. RTP for silicide formation is then performed. Sheet resistance is higher than in the other processes that use WN. Contact resistance is similar to that of Process 3. In addition, there are several process concerns with the ECVD of 500 Å of TiN. First, the process is slow and has a high carbon content. Second, 500 Å is a minimum thickness and this thickness can result in stress problems.

TABLE 1

| Process | M1 ohm/sq | Kelvin Contact (ohm/contact) N-channel 0.22 μm | N-channel 0.30 μm | P-channel 0.22 μm | P-channel 0.30 μm |
| --- | --- | --- | --- | --- | --- |
| Process 1 | | | | | |
| Ti(400Å)/WN/RTP | 0.94 | 126 | 61 | 1436 | 900 |
| after 800° C. 5 min anneal | 0.76 | 532 | 551 | n/a | n/a |
| Process 2 | | | | | |
| Ti(200Å)/RTP/WN | 1.31 | 129 | 65 | 237 | 151 |
| after 800° C. 5 min anneal | 1.33 | 349 | 359 | 2136 | 2413 |
| Process 3 | | | | | |
| Ti(200Å)/TiN(100Å)/RTP/WN | 1.25 | 72 | 41 | 240 | 204 |
| after 800° C. 5 min anneal | 1.20 | 373 | 366 | 1711 | 2013 |
| Process 4 | | | | | |
| Ti(200Å)/TiN(500Å)/RTP | 1.46 | 135 | 47 | 304 | 186 |
| after 800° C. 5 min anneal | 1.36 | 353 | 295 | 1603 | 1724 |

Table 1 shows the contact and sheet resistances for several processes and for both n-channel and p-channel transistors. Two transistor sizes are shown for each type. In all cases, Ti While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating a contact in an integrated circuit, comprising the steps of:
   forming a dielectric layer over a semiconductor body;
   forming a contact hole in said dielectric layer exposing a portion of said semiconductor body;
   forming a silicide layer in said contact hole by
      depositing a layer of titanium (ti) in said contact hole
      depositing a layer of titanium-nitride (tin) over said ti layer; and
      then performing a rapid thermal process (RTP) anneal to convert a portion of said ti layer to said silicide layer,
   depositing a tungsten-nitride (WN) layer over said suicide layer after said RTP step; and
   forming a metal interconnect layer over said WN layer.

2. The method of claim 1, wherein said performing a RTP anneal step occurs at a temperature in the range of 650–700° C. and a duration on the order of 30 sec.

3. The method of claim 1 wherein said Ti layer has a thickness on the order of 200 Å.

4. The method of claim 1, wherein said TiN layer has a thickness on the order of 100 Å.

5. The method of claim 1, wherein said WN layer has a thickness on the order of 300 Å.

6. The method of claim 1, wherein said metal interconnect layer comprises tungsten (W).

7. A method for fabricating an integrated circuit, comprising the steps of:
   forming a transistor in a semiconductor body;
   forming a dielectric layer over said transistor and said semiconductor body;
   forming a contact hole in said dielectric layer exposing source/drain region of said transistor;
   depositing a layer of titanium (Ti) in said contact hole;
   depositing a layer of titanium nitride (TiN) over said Ti layer;
   reacting said Ti layer with a surface of said source/drain region to form a silicide layer using a rapid thermal process (RTP) anneal after said step of depositing said layer of TiN;
   depositing a tungsten-nitride (WN) layer over said silicide layer; and
   forming a metal interconnect layer over said WN layer.

8. The method of claim 7, wherein said reacting step occurs at a temperature on the order of 650° C. and a duration on the order of 30 sec.

9. The method of claim 7, wherein said Ti layer has a thickness on the order of 200 Å.

10. The method of claim 7, wherein said TiN layer has a thickness on the order of 100 Å.

11. The method of claim 7, wherein said WN layer has a thickness on the order of 500 Å.

12. The method of claim 7, wherein said metal interconnect layer comprises tungsten (W).

* * * * *